United States Patent [19]

Hirakata

[11] Patent Number: 5,128,556
[45] Date of Patent: Jul. 7, 1992

[54] CURRENT-SWITCHING TYPE LOGIC CIRCUIT

[75] Inventor: Noriyuki Hirakata, Kanagawa, Japan

[73] Assignee: Sumitomo Electric Industries, Ltd., Osaka, Japan

[21] Appl. No.: 718,260

[22] Filed: Jun. 20, 1991

[30] Foreign Application Priority Data

Jun. 22, 1990 [JP] Japan .................. 2-165046

[51] Int. Cl.$^5$ .................. H03K 19/017; H03K 19/092
[52] U.S. Cl. .................. 307/448; 307/450; 307/296.8; 307/475
[58] Field of Search .............. 307/448, 450, 279, 455, 307/475, 296.8, 296.6

[56] References Cited

U.S. PATENT DOCUMENTS

| | | | |
|---|---|---|---|
| 4,177,390 | 12/1979 | Cappon | 307/450 |
| 4,450,369 | 5/1984 | Schuermeyer | 307/475 |
| 4,490,632 | 12/1984 | Everett et al. | 307/448 |
| 4,728,821 | 3/1988 | Yang et al. | 307/448 |
| 4,743,957 | 5/1988 | Hirayama | 307/475 |

Primary Examiner—David C. Nelms
Assistant Examiner—Richard Rossen
Attorney, Agent, or Firm—Cushman, Darby & Cushman

[57] ABSTRACT

A current-switching type compound semiconductor logic circuit which is high in an operating speed and low in power consumption. Voltage stabilizing transistors are provided to the logic circuit so that voltage signals which are in-phase with the gates of driving transistors and has a mean electric potential higher than that of the same by a predetermined value is applied to the gate thereof. The voltage stabilizing transistors act as a buffer to prevent electric potential of the driving transistors from fluctuating. As a result, it is possible to secure stable outputs in which the distortion of a waveform or the fluctuation of a cross point due to a jitter is hardly generated.

5 Claims, 3 Drawing Sheets

CURRENT-SWITCHING TYPE LOGIC CIRCUIT

BACKGROUND OF THE INVENTION

The present invention relates to a current-switching type logic circuit, and more particularly to a current-switching type compound semiconductor logic circuit which is high in an operating speed and low in power consumption.

There has been a great demand for a higher-speed information processing apparatus as an information-oriented society develops, and a higher-speed operation is required for a semiconductor device constituting the information processing apparatus. In order to meet with the requirement, semiconductor devices employing various compound semiconductors whose electron mobility is high have been developed in place of conventional semiconductor devices containing silicon as a main component, and the semiconductor devices have been applied to high-speed operating logic circuits or the like.

Nest, referring to FIG. 1, an invertor circuit constituted by an SCFL (source coupled FET logic) circuit employing a GaAs IC will be described as a conventional example of such a semiconductor device.

In FIG. 1, reference numeral 41 designates a source follower circuit section; 42, a switching section; 43 and 44, source follower transistors; 45 and 46, level-shifting diodes; 47 and 48, constant-current supply transistors; 49 and 50, load elements; 51 and 52, driving transistors; 53, a current source; 54 and 55, power source terminals; 56 and 57, input terminals; and 58 and 59, output terminals.

Generally, depletion-type transistors are employed in an SCFL circuit. The source follower circuit section 41 is provided because it is necessary to make the potential level of an output signal of the SCFL circuit lower than that of the drain terminal of each of the driving transistors in view of the matching property with a logic circuit in the succeeding stage. In this circuit, the level shifting of signal is performed by the gate-source voltage of each of the source follower transistors 43 and 44 and by a voltage drop across each of the level-shifting diodes 45 and 46.

The high-speed operation and reduction of power consumption of a logic circuit device are being attained by using a compound semiconductor as described above. In the compound semiconductor, however, it is disadvantageous in that the frequency characteristics of transistors are deteriorated because of an existence of unnecessary energy level.

It is considered that this problem is caused by the fact that no insulator, for example, a silicon oxide (SiO) for silicon, for forming a stable interface has been found and the composition of the compound semiconductor is hardly stabilized because it is composed of a plurality of elements.

There has been a problem in that unnecessary energy level may occur due to the foregoing reason thereby resulting in repeating charge and discharge whenever the potential level changes so that the frequency characteristics of transistors are deteriorated. This is so-called "drain-lag" which has also been discussed in a publication "IEEE J. of SSC Vo. 23, No. 2, 1988".

The above described deterioration of the frequency characteristics will be described hereinbelow with reference to the waveform diagram shown in FIG. 2.

First, in a first state having a duty ratio of 50% where a high level and a low level appear repeatedly at a predetermined interval, generated is an output signal having a waveform which is obtained by inverting the input signal without delay. Next, in a second state where the input signal continues to be in a low level for a long period of time and is then changed to be in a high level, there occurs a time lag between the changes in the signal levels of the input and output signals. More specifically, in the second state, after the input signal varies from the low level to the high level, the output signal varies from the high level to the low level with the time lag. In a third state where the input signal continues to be in a high level for a long time and is then changed to be in a low level, on the contrary, there occurs a time lag between the changes in the signal levels of the input and output signals. More specifically, in the third state, after the input signal varies from the high level to the low level, the output signal varies from the low level to the high level with the time lag. the jitter interval is changed between the leading and trailing edges of the input signal, the deterioration of the frequency characteristics appears as a variation of a cross point.

SUMMARY OF THE INVENTION

In view of the above, an object of the present invention is to eliminate such a difficulty as deterioration of the frequency characteristics and to provide a current-switching type compound semiconductor logic circuit which is high in an operating speed and low in power consumption.

According to the present invention, the above described, and other objects of the present invention is met to the provision of a current-switching type logic circuit comprising: a source follower circuit for producing a switching control signal in response to an input signal; and a switching circuit including at least one pair of driving transistors, low potential sides of which are connected to a common constant current source, load elements which are connected in series to high potential sides of the driving transistors, respectively, and voltage stabilizing transistors which are connected in series, respectively, between the high potential sides of the driving transistors and the load elements, each of the voltage stabilizing transistors operating on the basis of voltage stabilizing control signals which are in-phase with the switching control signal applied to the driving transistors and which have mean electric potential in-phase with the switching control signal applied to the driving transistors and which have mean electric potential higher than that of said switch control signal by a predetermined value.

With such a logic circuit according to the present invention, the drain potential of the driving compound semiconductor transistors is not remarkably fluctuated by changes in the input and output signal levels.

Since the drain potential of each of the driving compound semiconductor transistors is stabilized as described above, there occurs no level charge and discharge.

DESCRIPTION OF THE PREFERRED EMBODIMENTS

Figure 3:
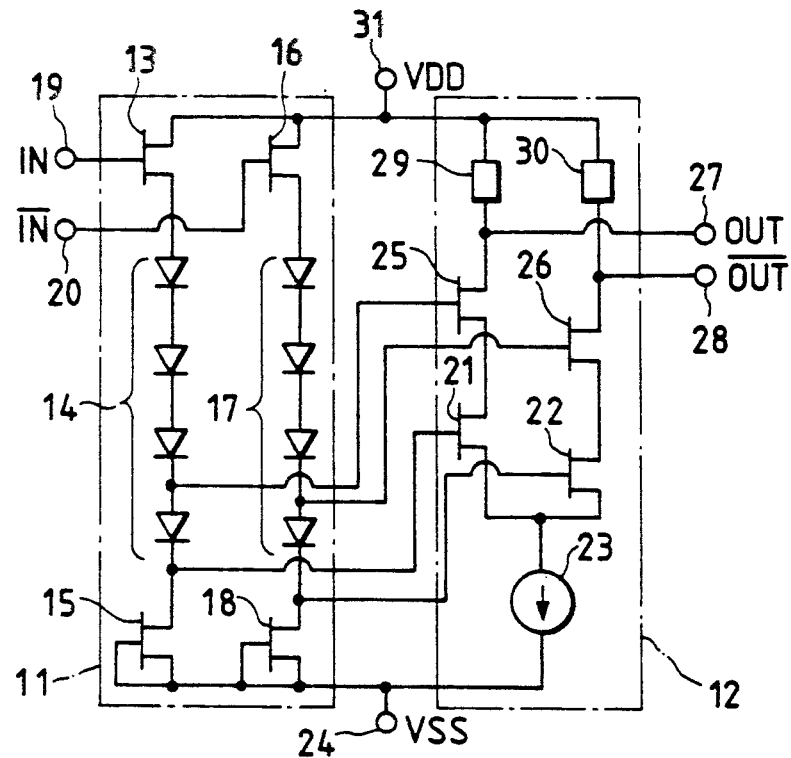
FIG. 3 is a circuit diagram showing an invertor which is a first embodiment of the present invention.

Referring to FIG. 3, description will be made as to an embodiment of the invertor circuit constituted by an SCFL (source coupled FET logic) circuit using a GaAs IC, according to the present invention.

FIG. 3 is a block diagram showing the embodiment of the invertor circuit. The invertor circuit is constituted by a source follower circuit section 11 and a switching section 12.

The source follower circuit section 11 includes a first source follower constituted by a source follower transistor 13, a series of diodes 14 for level-shifting and a constant-current supply transistor 15, and a second source follower constituted by a source follower transistor 16, a series of diodes 17 for level-shifting and a constant-current supply transistor 18. The gate of the source follower transistor 13 is connected to an input terminal 19, whereas the gate of the source follower transistor 16 is connected to an input terminal 20.

The switching section 12 includes driving transistors 21 and 22. The respective sources of the driving transistors 21 and 22 are connected to one end of a common current source 23, and the other end of the current source 23 is connected to a power source terminal 24. The drains of the driving transistors 21 and 22 are connected to voltage stabilizing transistors 25 and 26, respectively, and the drains of the voltage stabilizing transistors 25 and 26 are connected to output terminals 27 and 28, respectively. Further, the drains of the voltage stabilizing transistors 25 and 26 are connected to one ends of load elements 29 and 30, respectively, and the other ends of the load elements 29 and 30 are connected to a common power source terminal 31. The gate of the driving transistor 21 and the gate of the voltage stabilizing transistor 25 are connected to the level-shifting diodes 14, and, on the other hand, the gate of the driving transistor 22 and the gate of the voltage stabilizing transistor 26 are connected to the level-shifting diodes 17.

The respective voltage stabilizing transistors 25 and 26 are provided between the driving transistors 21, 22 and the load elements 29, 30, respectively, to thereby prevent undesired level charge and discharge from occurring.

The function of preventing generation of undesired level charge and discharge will be described in detail with reference to the voltage stabilizing transistor 25 for instance.

The gate of the voltage stabilizing transistor 25 is connected to the series of diodes 14 for level-shifting in such a manner that it is connected to a connecting position lower in the number of level-shifting diodes than a connecting position of the gate of the driving transistor 21. That is, a voltage signal which is in-phase with the gate of the driving transistor 21 and has a mean electric potential higher than that of the same by a predetermined value is applied to the gate of the voltage stabilizing transistor 25. Consequently, the voltage stabilizing transistor 25 acts as a buffer so that the electric potential of the driving transistor 21 can be prevented from fluctuating.

With such an invertor circuit as constructed above, there occurs no undesired level charge and discharge in the driving transistors 21 and 22.

The voltage stabilizing transistor 26 has the same function as that of the transistor 25.

A concrete example of the invertor circuit of the present invention will be described.

Assuming that FETs having the gate width of 100 μm are employed as FETs 13, 15, 16 and 18, FETs having the gate width of 200 μm are employed as FETs 21, 22, 25 and 26, resistors of 1KΩ are employed as resistors 29 and 30, a constant current source 23 supplies a current of 20 mA, the gate length of each FET is 1 μm and the threshold level of the FETs are $-0.5$ V, upon the application of $-5.2$ V to the terminal VSS and the application of $-0.8$ V to the input terminal 19 as a high level signal, there appears a voltage of $-0.8$ V at the source terminal of the FET 13 due to a current mirror arrangement of the FETs 13 and 15. This voltage is subjected to level-shifting by a series of Schottky barrier diodes each having a voltage drop of 0.6 V so that $-2.6$ V and $-3.2$ V are applied to the gates of the FETs 25 and 21, respectively. Similarly, when a low voltage signal of $-1.8$ V is applied to the input terminal 20, $-3.6$ V and $-4.2$ V are applied to the gates of the FETs 26 and 23, respectively. In this case, since the common source voltage of the FETs 21 and 22 is maintained at $-3.2$ V, the FET 22 is completely rendered non-conductive, and thus the current supplied by the constant current source 23 flows through the FET 21 entirely resulting in voltages of $-2.0$ V and 0 V appearing at the output terminals 27 and 28, respectively. The voltage appearing across the gate and source of the FET 25 is 0 V due to the current-mirror arrangement of the FETs 21 and 25, and therefore the drain-source voltage of the FET 21 is 0.6 V. Since the FET 22 is rendered nonconductive, there is no current flowing through the FET 26, and thus the gate-source voltage of the FET 26 is $-0.5$ V equal to its threshold voltage. Accordingly, the drain-source voltage of the FET 22 becomes equal to 1.1 V. In response to variation in a level of input signal to the input terminals 19 and 20, the gate-drain voltages of the FETs 21 and 22 also vary from 0.6 V to 1.1 V.

Figure 1:
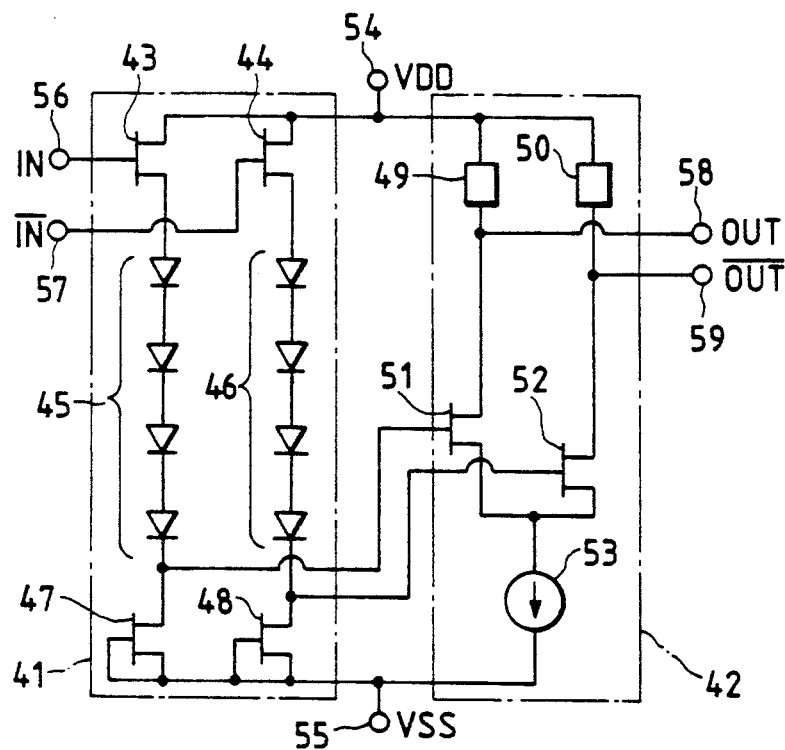
FIG. 1 is a circuit diagram showing the conventional invertor circuit.
Figure 2:
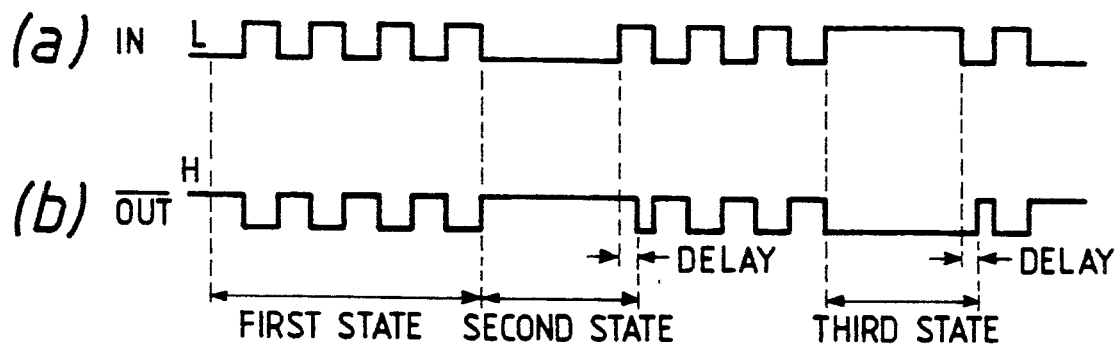
FIG. 2 is a waveform diagram of the conventional example of FIG. 1.

In case of a conventional invertor circuit as shown in FIG. 1 where no FETs corresponding to the FETs 25 and 26 are provided, the drains of the FETs 51 and 52 are directly connected to the output terminals 58 and 59. In this case, if the high level signal of $-0.8$ V is applied to the input terminal 56, the voltage of $-3.2$ V is applied to the gate of the FET 51, and then the voltage of $-2.0$ V appears at the output terminal 58 resulting in the voltage of 1.2 V appearing across the drain and gate of the FET 51. On the other hand, if the low level signal of 1.8 V is applied to the input terminal 57, the voltage of $-4.2$ V is applied to the gate of the FET 52, and then the voltage of 0 V appears at the output terminal 59. Accordingly, with such a circuit as shown in FIG. 1, the gate-drain voltages of the FETs 51 and 52 vary from 1.2V to 4.2 V.

As is apparent from the above concrete example, the variation in the drain-source voltages of the FETs 51 and 52 can be suppressed from 3.0 V to only 0.5 V to thereby prevent undesired level charge and discharge from occurring.

Although the present invention has been described with reference to an embodiment employing Schottky gate field effect transistors, the same effect is also obtained in the case of using bipolar transistors.

Further, the present invention can be applied to a more complicated semiconductor logic circuit such as an AND circuit, an OR circuit, a latch, or the like.

Figure 4:
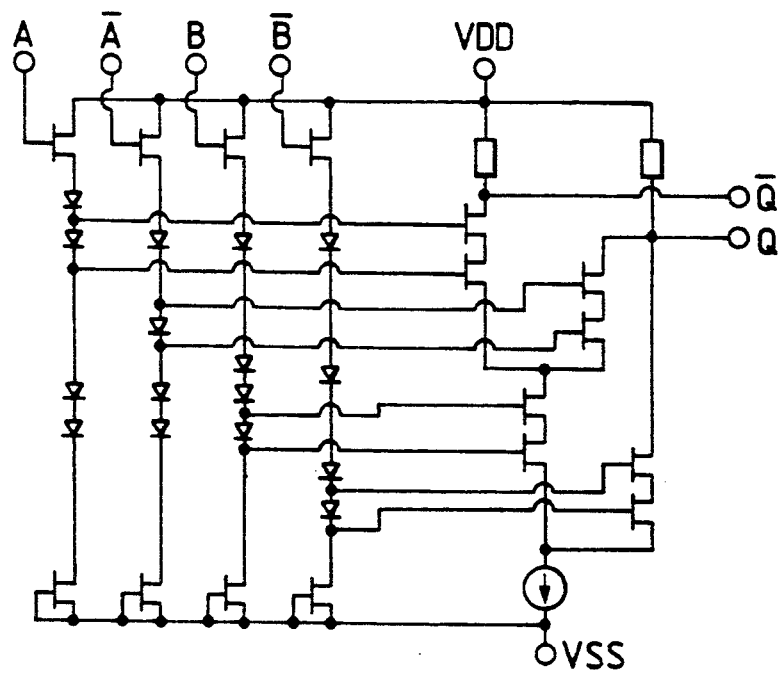
FIG. 4 is a circuit diagram showing an AND circuit which is a second embodiment of the invention.

FIG. 4 is a circuit diagram showing an example of an AND circuit to which the present invention is applied. In FIG. 4, as is similar to the invertor circuit shown in FIG. 3, input signals which are applied to input terminals A, $\bar{A}$, B and $\bar{B}$ are subjected to the same signal processing as above in a source follower circuit section so that a voltage signal which is in-phase with each gate of driving transistors and has a mean electric potential higher than that of the same by a predetermined value is applied to each gate of the voltage stabilizing transistors. To this end, it is possible to eliminate the drawbacks accompanying the convention one which is not provided with the above described voltage stabilizing transistors.

In addition, it should be noted that the AND circuit is modified by alternating the terminals A and $\bar{A}$, B and $\bar{B}$ and Q and $\bar{Q}$ so as to realize an OR circuit.

Figure 5:
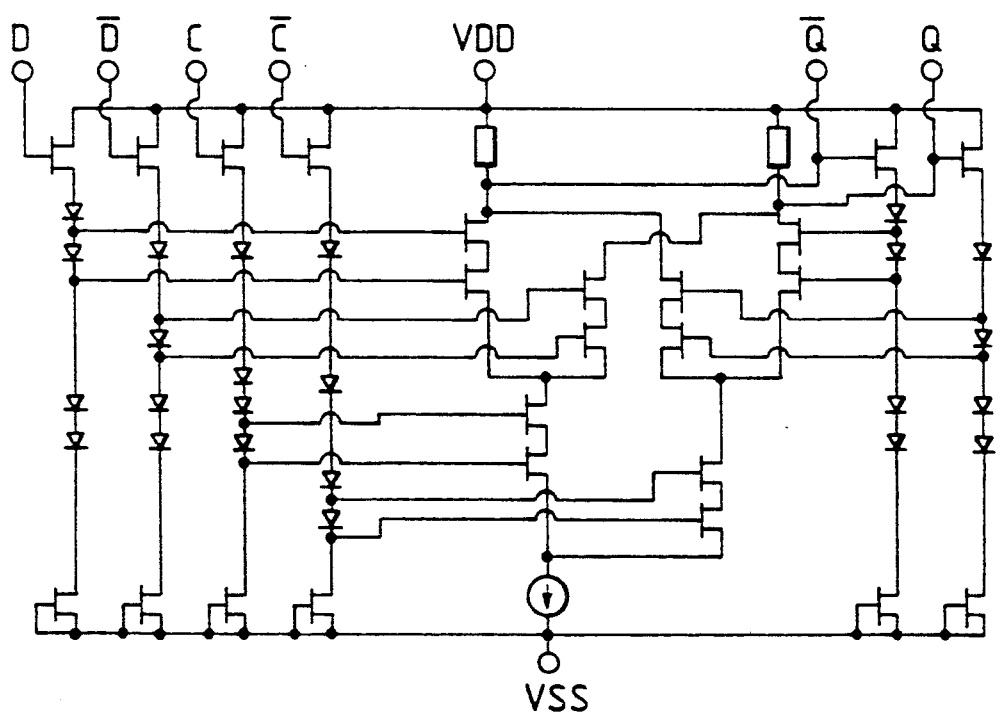
FIG. 5 is a circuit diagram showing a latch circuit which is a third embodiment of the invention.

Furthermore, FIG. 5 is a circuit diagram showing an example of a latch circuit in which reference characters D and $\bar{D}$ designate input terminals; C and $\bar{C}$, clock terminals and Q and $\bar{Q}$, output terminals. As is similar to the AND or OR circuit, the effect can be accomplished by the provision of voltage stabilizing transistors serving as a buffer.

As is apparent from the above, the logic circuit according to the present invention is advantageous in that it is possible to positively prevent undesired level charge and discharge from occurring. To this end, it is possible to secure a stable output in which the distortion of a waveform or the fluctuation of a cross point due to a jitter is hardly generated.

What is claimed is:

1. A current-switching type logic circuit comprising:
   a source follower circuit means for producing a switching control signal in response to an input signal; and
   a switching circuit means including at least one pair of driving transistors, low potential sides of which are connected to a common constant current source, load elements which are connected in series to high potential sides of said driving transistors, respectively, and voltage stabilizing transistors which are connected in series, respectively, between the high potential sides of said driving transistors and said load elements, each of said voltage stabilizing transistors operating on the basis of voltage stabilizing control signal which are in-phase with the switching control signal applied to said driving transistor and which have mean electric potential higher than that of said switch control signal by a predetermined value.

2. The current-switching type logic circuit as defined in claim 1 wherein source terminals of said driving transistors are connected in common to said constant current source.

3. The current-switching type logic circuit as defined in claim 2 wherein said driving transistors are compound-semiconductor transistors.

4. The current-switching type logic circuit as defined in claim 1 wherein said source follower circuit section comprises first and second source follower circuits each including a series of a source follower transistor, level shifting means and a constant current source.

5. The current-switching type logic circuit as defined in claim 4 wherein said level shifting means comprises a series of Schottky barrier diodes, and the predetermined value is 0.6 V.

* * * * *